United States Patent
Kuribayashi

(10) Patent No.: US 12,332,557 B2
(45) Date of Patent: Jun. 17, 2025

(54) LIGHT SOURCE MODULE

(71) Applicant: Toshiba Tec Kabushiki Kaisha, Tokyo (JP)

(72) Inventor: Yasushi Kuribayashi, Mishima Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/470,102

(22) Filed: Sep. 19, 2023

(65) Prior Publication Data
US 2025/0093795 A1     Mar. 20, 2025

(51) Int. Cl.
| G03B 21/20 | (2006.01) |
| G02B 27/10 | (2006.01) |
| G02B 27/14 | (2006.01) |
| G03G 15/04 | (2006.01) |
| H01S 5/02375 | (2021.01) |

(52) U.S. Cl.
CPC ....... *G03B 21/2013* (2013.01); *G02B 27/106* (2013.01); *G02B 27/14* (2013.01); *G03B 21/2033* (2013.01); *G03B 21/2066* (2013.01); *G03G 15/04072* (2013.01); *H01S 5/02375* (2021.01); *G03G 2215/0404* (2013.01); *G03G 2215/0421* (2013.01)

(58) Field of Classification Search
CPC ............ G03B 21/2013; G03B 21/2066; G03B 21/208; G02B 27/14; G02B 19/0057; G03G 15/0409
See application file for complete search history.

(56) References Cited

U.S. PATENT DOCUMENTS

| 7,333,254 | B2 * | 2/2008 | Amada | ................ H04N 1/1135 |
| | | | | 359/196.1 |
| 9,266,351 | B2 * | 2/2016 | Suzuki | .................... B41J 2/455 |
| 2004/0125192 | A1 | 7/2004 | Ohsugi | |
| 2021/0286247 | A1 * | 9/2021 | Hsu | .................... G03B 21/2066 |

FOREIGN PATENT DOCUMENTS

| JP | H07-181411 A | 7/1995 |
| JP | 2004-333717 A | 11/2004 |
| JP | 2005266492 | * 9/2005 |
| JP | 2005266492 A | * 9/2005 |

* cited by examiner

*Primary Examiner* — Jessica L Eley
(74) *Attorney, Agent, or Firm* — FOLEY & LARDNER LLP

(57) ABSTRACT

A light source module includes a first light source, a second light source, a beam combiner, a substrate, and an adjuster. The first light source emits a first light beam. The second light source emits a second light beam parallel to the first light beam. The beam combiner combines and emits the first light beam and the second light beam. The first light source and the second light source are mounted on the substrate. The adjuster adjusts a mounting height of at least one of the first light source or the second light source on the substrate to vary at least one of (a) a first optical path length of the first light beam or (b) a second optical path length of the second light beam.

14 Claims, 17 Drawing Sheets

LIGHT SOURCE MODULE

FIELD

Embodiments described herein relate generally to, for example, a light source module of an optical scanning device of an image forming apparatus installed in a workplace.

BACKGROUND

In recent years, in order to increase pixel density, an optical scanning device of an image forming apparatus sometimes includes a light source module including two semiconductor lasers. For example, the light source module of this type combines, using a light combining element, light beams emitted from the two semiconductor lasers and makes the combined light beam incident on a polygon mirror. The polygon mirror rotates to thereby polarize the combined light beam in a main scanning direction and exposes and scans the surface (an image plane) of a photoconductive drum.

In order to combine the light beams and focus on the image plane, it is necessary to align optical path lengths from light emitting surfaces of the two semiconductor lasers to a light combining surface of the light combining element. Therefore, if the light combining element is used, it is difficult to attach the two semiconductor lasers to the same substrate.

DETAILED DESCRIPTION

Figure 1:
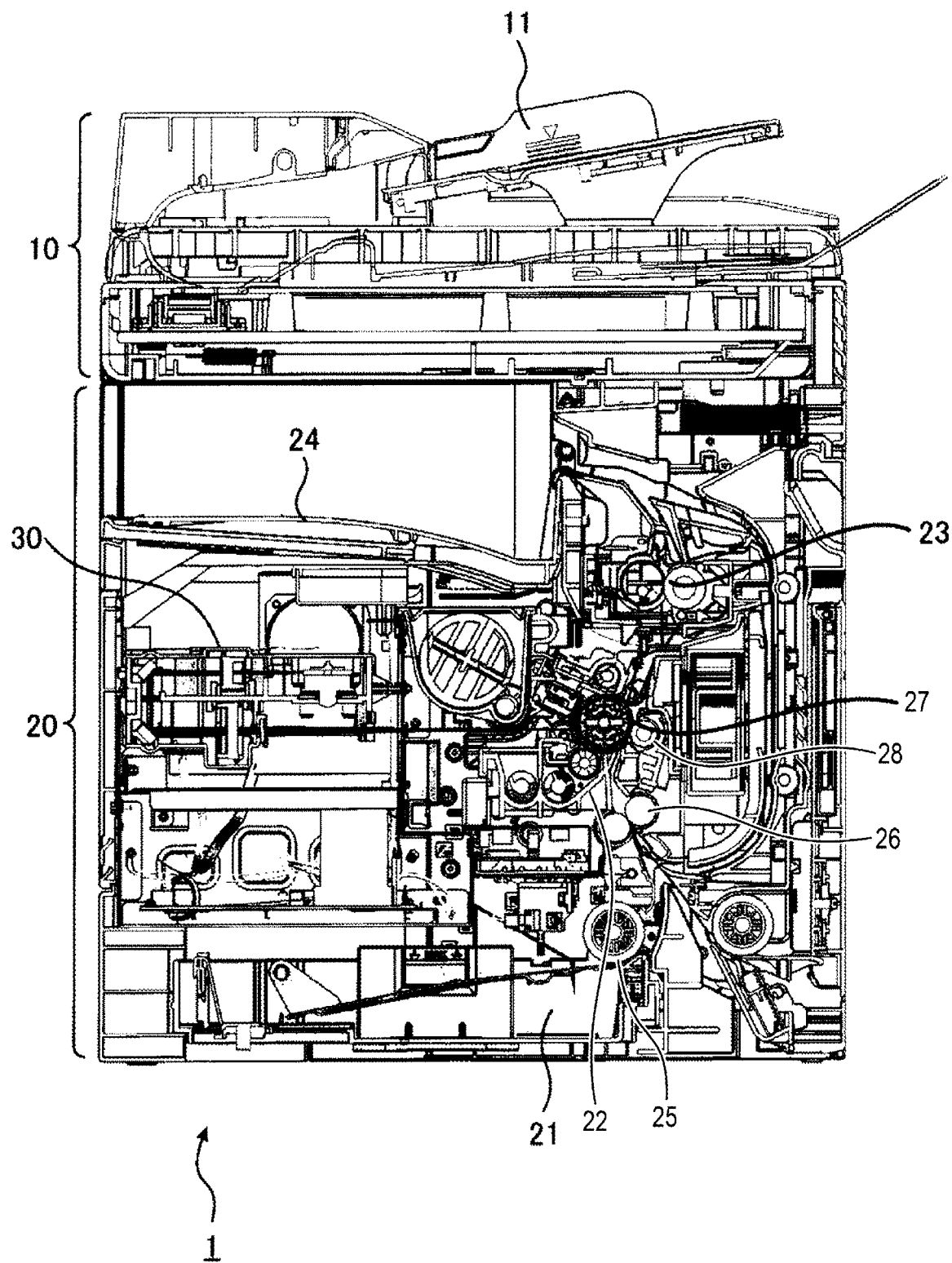
FIG. 1 is a longitudinal sectional view of an image forming apparatus including an optical scanning device including a light source module according to an embodiment.

A light source module according to an embodiment includes a first light source, a second light source, a beam combiner, a substrate, and an adjuster. The first light source emits a first light beam. The second light source emits a second light beam parallel to the first light beam. The beam combiner combines and emits the first light beam and the second light beam. The first light source and the second light source are mounted on the substrate. The adjuster adjusts a mounting height of at least one of the first light source or the second light source on the substrate to vary at least one of (a) a first optical path length of the first light beam that extends from the first light source to a position where the first light beam is combined with the second light beam by the beam combiner or (b) a second optical path length of the second light beam that extends from the second light source to the position where the first light beam is combined with the second light beam by the beam combiner.

Embodiments are explained below with reference to the drawings. In the drawings referred to in the explanation of the embodiments, scales of units are sometimes changed as appropriate. In the drawings referred to in the explanation of the embodiments, parts of components and reference numerals and signs of the components are sometimes omitted for convenience of explanation.

Image Forming Apparatus

First, an image forming apparatus 1 is explained with reference to FIG. 1. The image forming apparatus 1 is, for example, a multifunction peripheral (MFP). The image forming apparatus 1 includes an image reading unit 10 and an image forming unit 20. The image reading unit 10 scans and reads images of a sheet original document and a book original document. The image forming unit 20 forms a developer image on a sheet based on image data read from an original document in the image reading unit 10, image data transmitted from external equipment to the image forming apparatus 1, or the like.

The image reading unit 10 includes an automatic document feeder (ADF) 11. The image reading unit 10 reads an image of a sheet original document conveyed by the automatic document feeder 11, a book original document placed on an original document stand, or the like. The image forming unit 20 includes a paper feeding cassette 21, a developing device 22, an optical scanning device 30, a fixing device 23, and a paper discharge tray 24.

A pickup roller 25 of the image forming unit 20 picks up a sheet stored in the paper feeding cassette 21. A conveying roller 26 conveys the sheet picked up from the paper feeding cassette 21 to a photoconductive drum 27. The optical scanning device 30 exposes and scans the surface of the photoconductive drum 27 with a light beam based on image data and forms an electrostatic latent image on the surface of the photoconductive drum 27. The developing device 22 supplies a developer to the electrostatic latent image formed on the surface of the photoconductive drum 27 and forms a developer image on the surface of the photoconductive drum 27. The transfer roller 28 transfers the developer image formed on the surface of the photoconductive drum 27 onto the sheet. The fixing device 23 fixes the transferred developer image on the sheet. The sheet after the image formation having passed through the fixing device 23 is stacked on the paper discharge tray 24.

The image forming apparatus 1 illustrated in FIG. 1 is an example. The image forming apparatus 1 may have any structure if the image forming apparatus 1 can form a developer image on a sheet.

Optical Scanning Device

Figure 2:
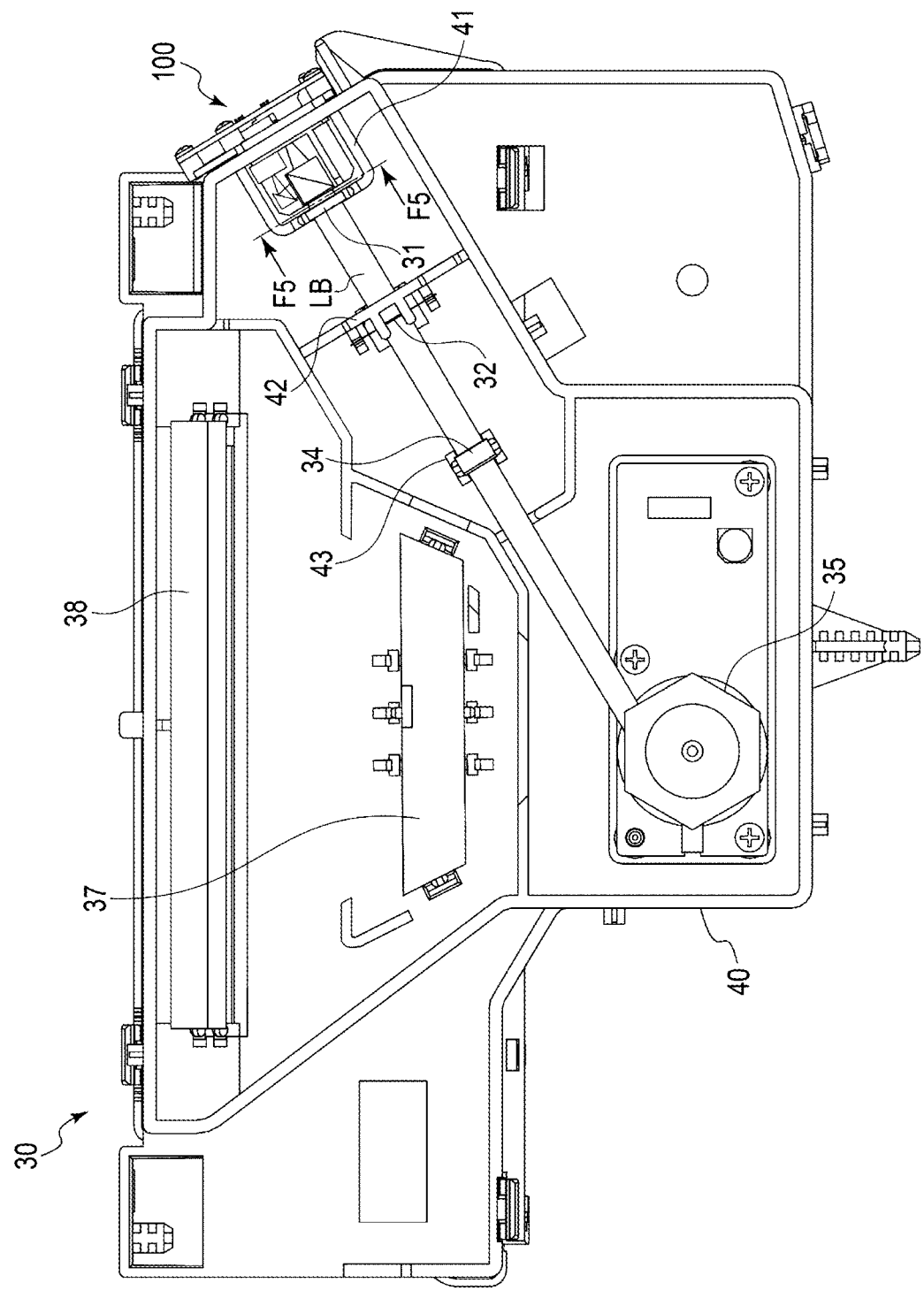
FIG. 2 is a top view of the optical scanning device illustrated in FIG. 1.
Figure 3:
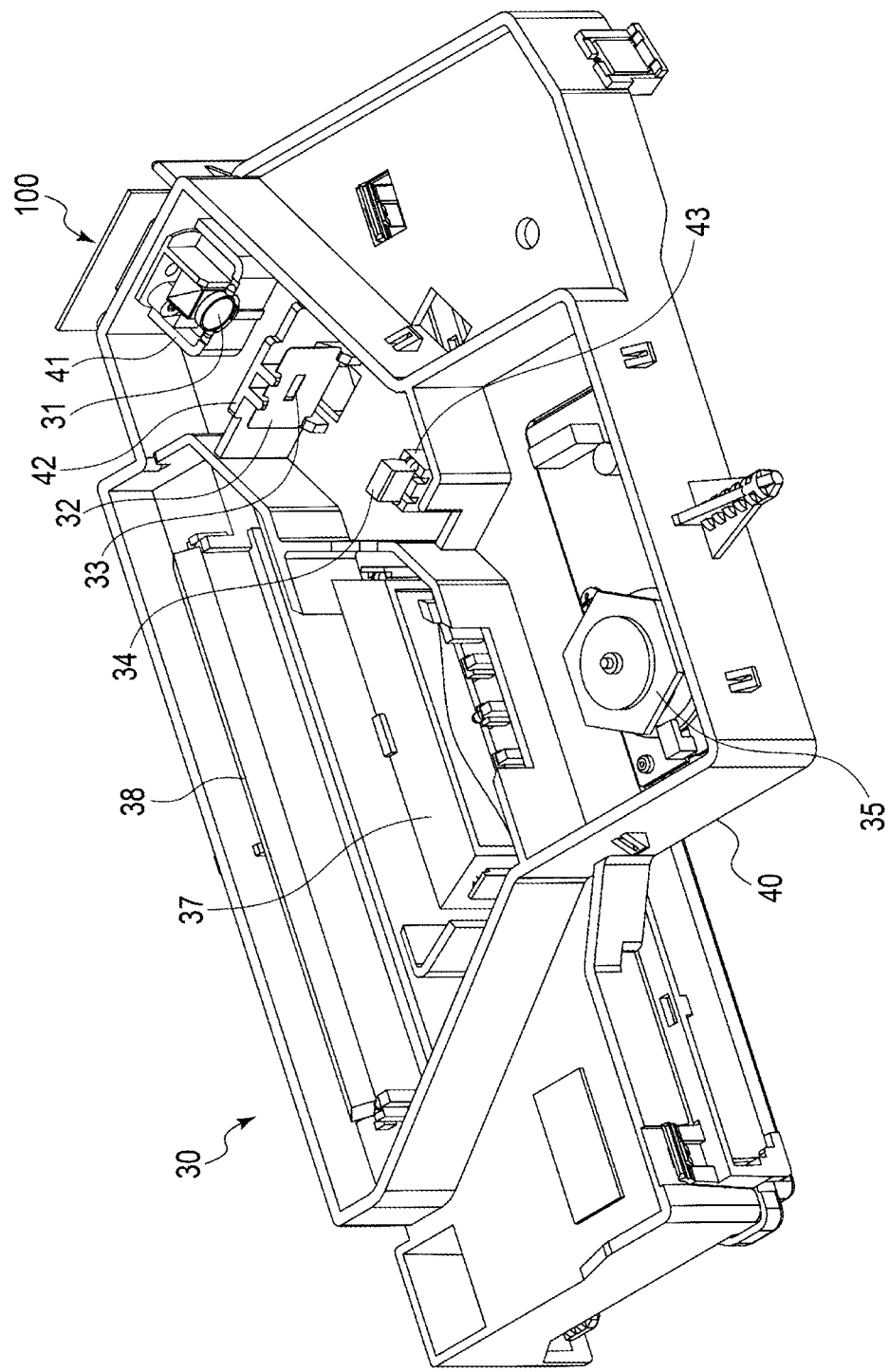
FIG. 3 is a perspective view of the optical scanning device.

Subsequently, the optical scanning device 30 is explained with reference to FIGS. 2 and 3. The optical scanning device 30 includes a light source module 100. The optical scanning device 30 includes a housing 40 to which the light source module 100 is attached. The light source module 100 emits a light beam of divergent light. An optical axis LA (FIG. 9) of the light source module 100 is an axis coinciding with a principal ray of a light beam LB emitted from the light source module 100. The light source module 100 rotates centering on the optical axis LA and adjusts an angle of attachment to the housing 40. The light source module 100 is explained in detail below.

The optical scanning device 30 includes a collimator lens 31, a diaphragm plate 32, a cylindrical lens 34, a polygon mirror 35, an fθ lens 37, and a turning-back mirror 38. The housing 40 fixes the collimator lens 31, the diaphragm plate 32, the cylindrical lens 34, the polygon mirror 35, the fθ lens 37, and the turning-back mirror 38 respectively in predetermined positions.

The light beam LB emitted from the light source module 100 is made incident on the collimator lens 31. The collimator lens 31 converts the light beam LB of the divergent light emitted from the light source module 100 into a light beam LB of parallel light. The housing 40 includes a lens holder 41 for fixing the collimator lens 31. The lens holder 41 holds the collimator lens 31 to locate the center axis of the collimator lens 31 on the optical axis LA of the light source module 100.

The light beam LB transmitted through the collimator lens 31 is made incident on the diaphragm plate 32. As illustrated in FIG. 3, the diaphragm plate 32 includes a substantially rectangular opening 33 for shaping the light beam LB. The diaphragm plate 32 allows, in the light beam LB transmitted through the collimator lens 31, light made incident on the opening 33 to pass and blocks, in the light beam LB, light not made incident on the opening 33. The housing 40 includes a diaphragm holder 42 for fixing the diaphragm plate 32. The diaphragm holder 42 holds the diaphragm plate 32 to locate the center of the opening 33 on the optical axis LA of the light source module 100.

The light beam LB having passed through the opening 33 of the diaphragm plate 32 is made incident on the cylindrical lens 34. The cylindrical lens 34 condenses, in a sub-scanning direction, the light beam LB having passed through the opening 33 of the diaphragm plate 32. The sub-scanning direction is a direction perpendicular to the paper surface in FIG. 2. A main scanning direction orthogonal to the sub-scanning direction is the left-right direction of FIG. 2. The housing 40 includes a lens holder 43 for fixing the cylindrical lens 34. The lens holder 43 holds the cylindrical lens 34 to locate the center of the cylindrical lens 34 on the optical axis LA of the light source module 100.

The light beam LB transmitted through the cylindrical lens 34 is made incident on the polygon mirror 35. The housing 40 rotatably holds the polygon mirror 35. The polygon mirror 35 includes a plurality of reflecting surfaces in the outer circumference centering on the rotation axis of the polygon mirror 35. The polygon mirror 35 reflects the light beam LB having passed through the cylindrical lens 34 toward the fθ lens 37. The polygon mirror 35 rotates to thereby scan the light beam LB in the main scanning direction.

The light beam LB reflected by the polygon mirror 35 is made incident on the fθ lens 37. The housing 40 fixes the fθ lens 37 to a predetermined position. The fθ lens 37 extends in the main scanning direction and condenses, in the sub-scanning direction, the light beam LB reflected by the polygon mirror 35. The light beam LB transmitted through the fθ lens 37 is made incident on the turning-back mirror 38.

The turning-back mirror 38 reflects the light beam LB transmitted through the fθ lens 37. The light beam LB reflected on the turning-back mirror 38 passes through a cover glass and travels to the surface of the photoconductive drum 27 as illustrated in FIG. 1. The light beam LB forms a condensing spot on the surface of the photoconductive drum 27 with condensing action of the cylindrical lens 34 and the fθ lens 37. The condensing spot of the light beam LB moves in the main scanning direction on the surface of the photoconductive drum 27 according to the rotation of the polygon mirror 35.

Light Source Module

Figure 4:
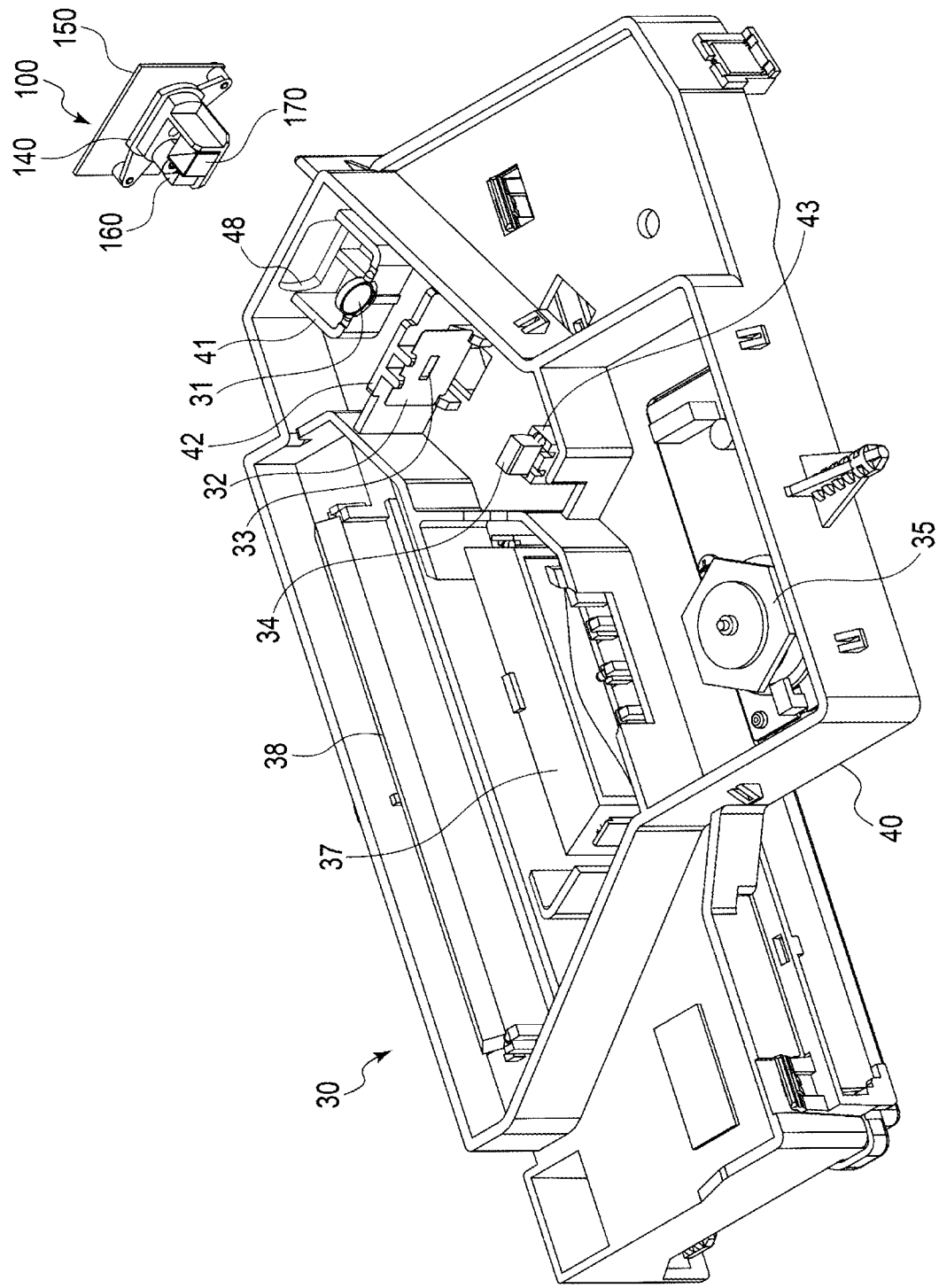
FIG. 4 is a perspective view illustrating a state in which the light source module of the optical scanning device illustrated in FIG. 3 is separated from a housing.
Figure 5:
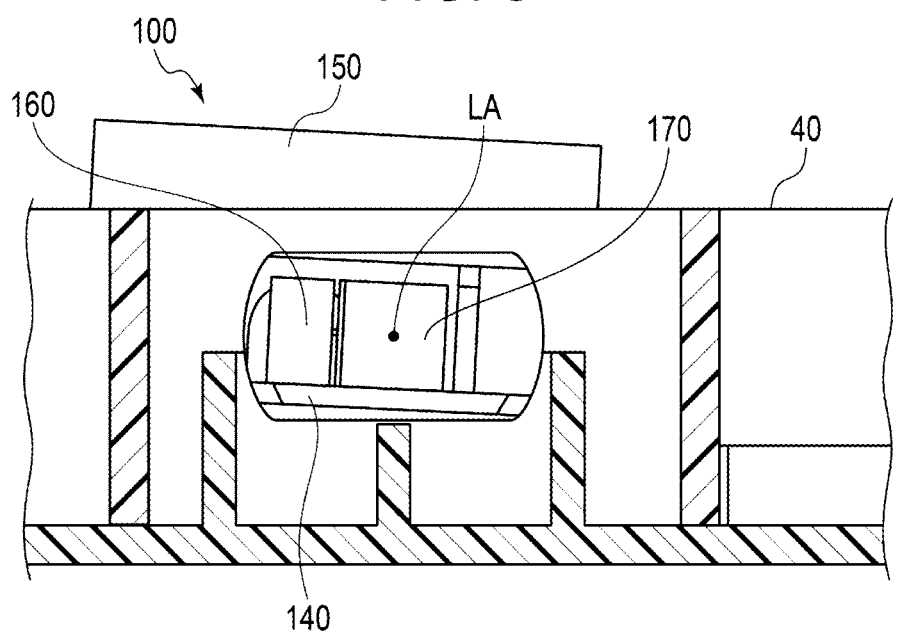
FIG. 5 is a sectional view of the optical scanning device taken along an F5-F5 line illustrated in FIG. 2.
Figure 6:
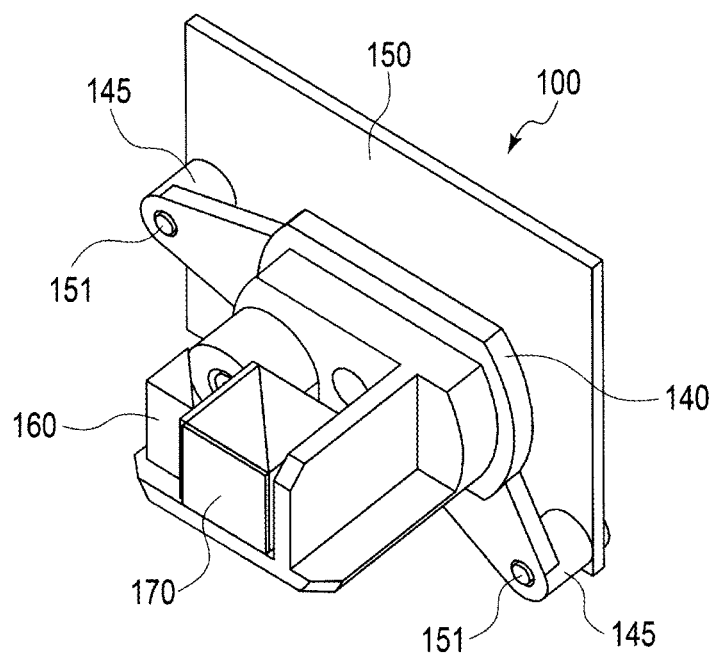
FIG. 6 is a perspective view of the light source module.
Figure 7:
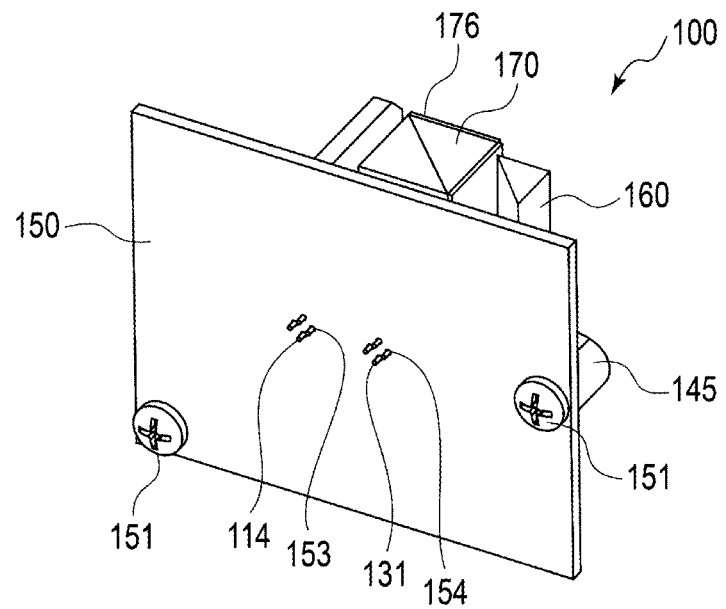
FIG. 7 is a perspective view of the light source module viewed from the opposite side of FIG. 6.
Figure 8:
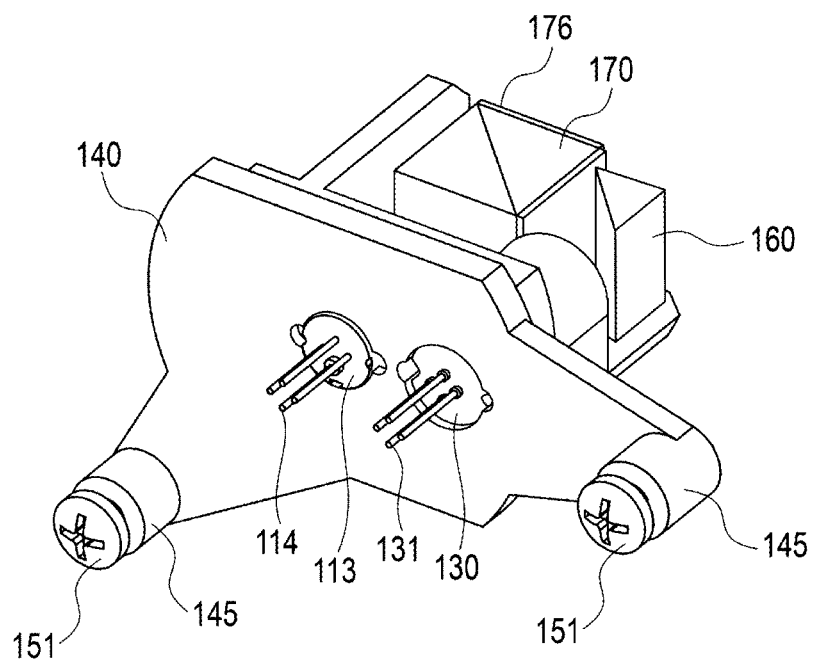
FIG. 8 is a perspective view illustrating a state in which a substrate is removed from the light source module illustrated in FIG. 7.
Figure 9:
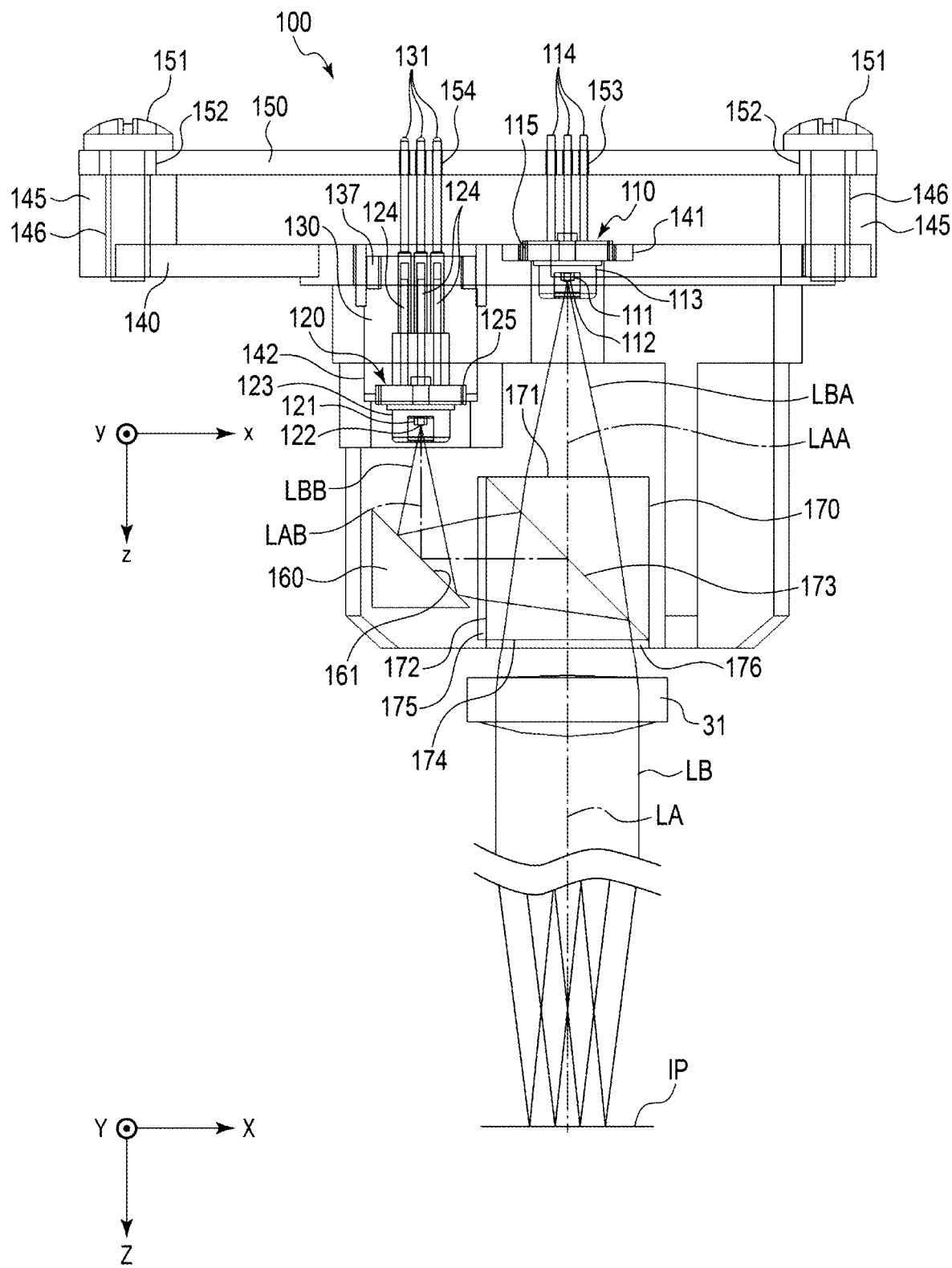
FIG. 9 is a plan view of the light source module illustrated in FIG. 6.
Figure 10:
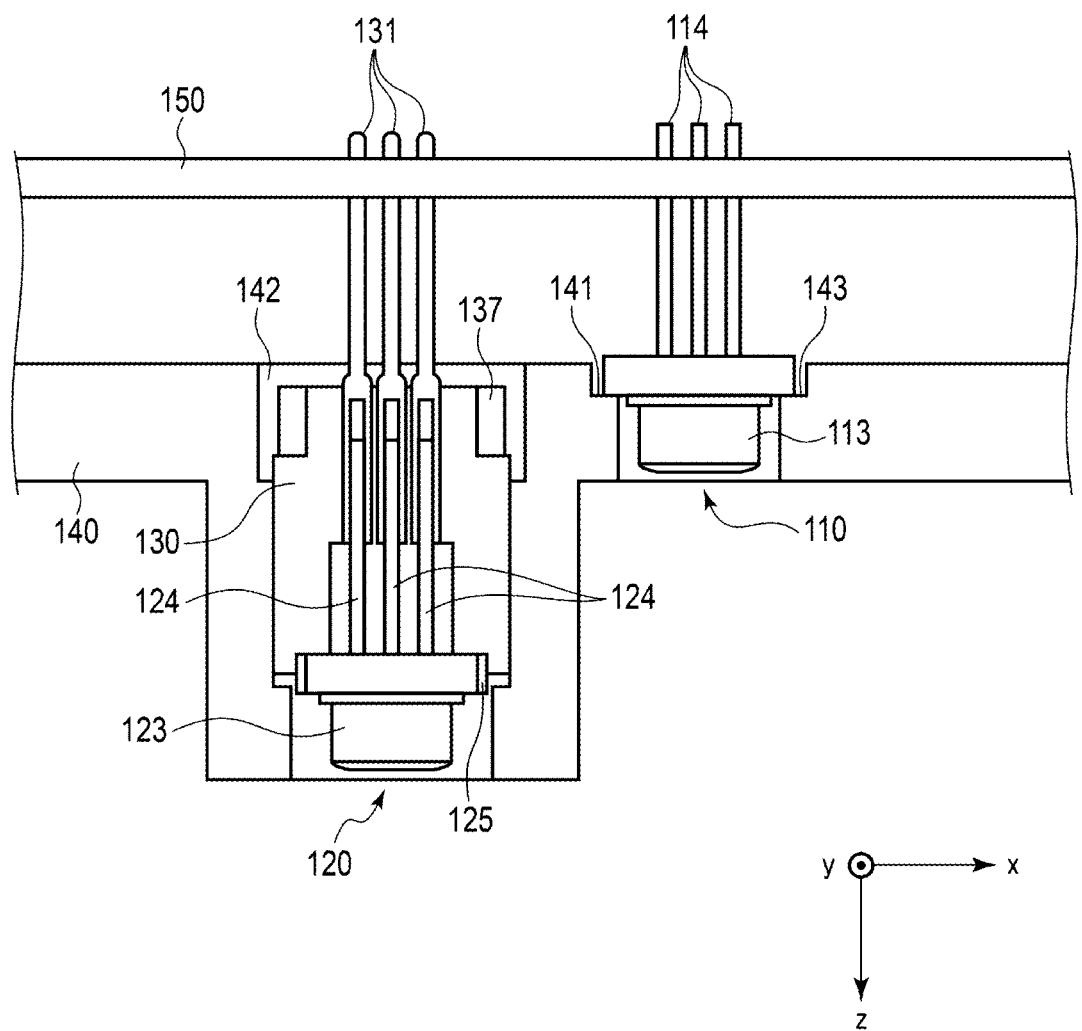
FIG. 10 is a schematic diagram illustrating a main part of the light source module illustrated in FIG. 9 in a simplified form.

Subsequently, the light source module 100 is explained with reference to FIGS. 4 to 10. FIG. 4 is a perspective view illustrating the optical scanning device 30 in a state in which the light source module 100 is separated from the housing 40. FIG. 5 is a sectional view of the optical scanning device 30 taken along an F5-F5 line illustrated in FIG. 2. FIG. 6 is a perspective view of the light source module 100. FIG. 7 is a perspective view of the light source module 100 illustrated in FIG. 6 viewed from the opposite side. FIG. 8 is a perspective view illustrating a state in which a substrate 150 is removed from the light source module 100. FIG. 9 is a plan view of the light source module 100. FIG. 10 is a schematic diagram illustrating a main part of FIG. 9 in a simplified form.

In FIG. 9, the collimator lens 31 and an image plane IP are illustrated in addition to the light source module 100. The image plane IP is a surface on which the light beam LB is condensed by an optical system of the optical scanning device 30 and, in this embodiment, is equivalent to the surface of the photoconductive drum 27. The surface of the photoconductive drum 27 is strictly a cylindrical surface. However, since the condensing spot of the light beam LB is extremely small, the curvature of the surface of the photoconductive drum 27 can be substantially neglected. Here, for convenience, the surface of the photoconductive drum 27 is regarded as a plane.

In the following explanation, for convenience of explanation, as illustrated in FIG. 9, an xyz orthogonal coordinate system is defined for the light source module 100 and an XYZ orthogonal coordinate system is defined for the image plane IP. In the xyz orthogonal coordinate system, a zx plane is parallel to the paper surface of FIG. 9. In the XYZ orthogonal coordinate system, a ZX plane is parallel to the paper surface of FIG. 9. A z axis is parallel to an optical axis LAA and an optical axis LAB. The optical axis LA is an optical axis of the optical system of the optical scanning device 30 but is simplified and drawn as a straight line in FIG. 9. The optical axis LA is scanning along an X axis, which is in the main scanning direction, but is drawn in the center position in the main scanning direction perpendicular to the image plane IP in FIG. 9.

The light source module 100 includes a first semiconductor laser 110 (e.g., a first light source) that emits a first light beam LBA, a second semiconductor laser 120 (e.g., a second light source) that emits a second light beam LBB parallel to the first light beam LBA, an LD socket 130 (e.g., an adjusting unit, an adjuster) connected to the second semiconductor laser 120, a holder 140 (e.g., a holding unit, a holder, a fixture, a housing) that holds the first semiconductor laser 110 and the LD socket 130 (that is, the second semiconductor laser 120), one substrate 150 on which the first semiconductor laser 110 is mounted, the second semiconductor laser 120 is mounted via the LD socket 130, and a driving circuit and the like for the first semiconductor laser 110 and the second semiconductor laser 120 are mounted, a light reflecting element 160 (e.g., a reflecting unit, a reflector), and a light combining element 170 (e.g., a combining unit, a beam combiner).

The first semiconductor laser 110 includes a first LD chip 111. The second semiconductor laser 120 includes a second LD chip 121. LD means laser diode. The first LD chip 111 and the second LD chip 121 may be respectively LD chips of a two-beam array in which two LDs that emit light beams are provided in parallel. The first LD chip 111 and the second LD chip 121 are not limited to the two-beam array and may be, for example, a four-beam array in which four LDs are linearly arranged.

The first LD chip 111 includes a first light emitting surface 112. The second LD chip 121 includes a second light emitting surface 122. The first LD chip 111 emits the first light beam LBA from the first light emitting surface 112 perpendicularly to the first light emitting surface 112. The second LD chip 121 emits the second light beam LBB from the second light emitting surface 122 perpendicularly to the second light emitting surface 122. Both of the first light beam LBA and the second light beam LBB are divergent lights.

The first semiconductor laser 110 includes a substantially cylindrical first CAN package 113. The first CAN package 113 seals the first LD chip 111. The second semiconductor laser 120 includes a substantially cylindrical second CAN package 123. The second CAN package 123 seals the second LD chip 121. First connection terminals 114 extend from the first CAN package 113. Second connection terminals 124 extend from the second CAN package 123. In some embodiments, the first semiconductor laser 110 and the second semiconductor laser 120 have the same structure.

The LD socket 130 is a rotating body having a center axis and is disposed between the second semiconductor laser 120 and the substrate 150. The LD socket 130 holds the second semiconductor laser 120 to be coaxial with the second CAN package 123 of the second semiconductor laser 120. The LD socket 130 includes connection terminals 131 electrically connected to the second connection terminals 124 of the second semiconductor laser 120. The connection terminals 131 of the LD socket 130 extend the second connection terminals 124 of the second semiconductor laser 120. The LD socket 130 is a socket for adjusting a mounting height of the second semiconductor laser 120 on the substrate 150. The LD socket 130 is explained below.

The holder 140 includes a substantially cylindrical first attachment hole 141 to which the first semiconductor laser 110 is attached and a substantially cylindrical second attachment hole 142 to which the LD socket 130 connected to the second semiconductor laser 120 is attached. Since the outer diameter of the LD socket 130 is larger than the outer diameter of the second semiconductor laser 120, the inner diameter of the second attachment hole 142 is larger than the inner diameter of the first attachment hole 141. Since the length in the axial direction of the LD socket 130 is larger than the length in the axial direction of the second CAN package 123 of the second semiconductor laser 120, the length in the axial direction of the second attachment hole 142 is larger than the length in the axial direction of the first attachment hole 141. The first attachment hole 141 and the second attachment hole 142 are respectively holes piecing through the holder 140 and are holes substantially parallel to each other.

The holder 140 holds the first semiconductor laser 110 in a state in which the first CAN package 113 of the first semiconductor laser 110 is disposed in the first attachment hole 141. The first semiconductor laser 110 is fixed to the holder 140 by, for example, an adhesive. The holder 140 holds the second semiconductor laser 120 in a state in which the LD socket 130 connected to the second semiconductor laser 120 is disposed in the second attachment hole 142. The LD socket 130 is fixed to the holder 140 by, for example, an adhesive.

The holder 140 holds the first semiconductor laser 110 and the LD socket 130 such that the optical axis LAA of the first light beam LBA emitted by the first semiconductor laser 110 and the optical axis LAB of the second light beam LBB emitted by the second semiconductor laser 120 held by the LD socket 130 are parallel. The holder 140 holds the first semiconductor laser 110 and the second semiconductor laser 120 to be separated in the x-axis direction.

The holder 140 includes, on the inner circumferential surface of the first attachment hole 141, a substantially annular positioning step section 143 (e.g., a movement restricting section) against which a part of the first CAN package 113 of the first semiconductor laser 110 is struck to be positioned in the z-axis direction. A cross section of the first attachment hole 141 parallel to an xy plane has a size for allowing movement in the x-axis direction and the y-axis direction of the first CAN package 113 of the first semiconductor laser 110 over the entire length in the axial direction of the first attachment hole 141. Therefore, the position in the z-axis direction of the first semiconductor laser 110 is determined by striking a part of the first CAN package 113 against the positioning step section 143 of the first attachment hole 141. The position of the first semiconductor laser 110 with respect to the holder 140 can be adjusted in the x-axis direction and the y-axis direction.

On the other hand, the inner diameter of the second attachment hole 142 of the holder 140 is slightly larger than the outer diameter of the LD socket 130. The LD socket 130 is held by precise fitting. Therefore, the LD socket 130 is prohibited from moving in the x-axis direction and the y-axis direction in a state in which the LD socket 130 is housed in the second attachment hole 142 of the holder 140. In this state, the positions in the x-axis direction and the y-axis direction of the LD socket 130 with respect to the holder 140 are determined. On the other hand, the LD socket 130 is capable of moving in the z-axis direction with respect to the holder 140. It is possible to adjust the position of the LD socket 130 in the z-axis direction with respect to the holder 140. The LD socket 130 is capable of rotating centering on the z axis in a state in which the LD socket 130 is fit in the second attachment hole 142 of the holder 140.

The holder 140 integrally includes substantially cylindrical two projecting sections 145 for fixing the substrate 150. The number of projecting sections 145 is not limited to two and may be three or more. The projecting sections 145 function as spacers between the holder 140 and the substrate 150. The projecting sections 145 include screw holes 146 having female screws. The substrate 150 includes two insertion holes 152 for inserting screws 151 in positions facing the two projecting sections 145. The substrate 150 is fixed to the holder 140 by screwing the screws 151 inserted through the insertion holes 152 into the screw holes 146 of the projecting sections 145 of the holder 140.

The substrate 150 includes first through-holes 153 through which the first connection terminals 114 of the first semiconductor laser 110 are inserted and second through-holes 154 through which the connection terminals 131 of the LD socket 130 connected to the second semiconductor laser 120 are inserted. The first connection terminals 114 of the first semiconductor laser 110 extend piercing through the first through-holes 153 of the substrate 150. The connection terminals 131 of the LD socket 130 extend piercing through the second through-holes 154 of the substrate 150. The first connection terminals 114 of the first semiconductor laser 110 and the connection terminals 131 of the LD socket 130 are electrically connected and mechanically fixed to the substrate 150 by soldering after the positions of the first semiconductor laser 110 and the LD socket 130 (e.g., the second semiconductor laser 120) are adjusted with respect to the holder 140 as explained below.

The holder 140 fixes the light combining element 170 in a position facing the first light emitting surface 112 of the first semiconductor laser 110 in the z-axis direction. Since the holder 140 disposes the first semiconductor laser 110 and the second semiconductor laser 120 in parallel in the x-axis direction, the light combining element 170 does not face the second light emitting surface 122 of the second semiconductor laser 120 in the z-axis direction. Therefore, the first light beam LBA emitted from the first semiconductor laser 110 is directly made incident on the light combining element 170. The second light beam LBB emitted from the second semiconductor laser 120 is made incident on the light combining element 170 via the light reflecting element 160. The light combining element 170 brings the optical axis LAA of the first light beam LBA and the optical axis LAB of the second light beam LBB close to each other in the x-axis direction to combine the first light beam LBA and the second light beam LBB and emits the first light beam LBA and the second light beam LBB as the light beam LB.

The light combining element 170 is, for example, a cube-type polarization beam splitter and includes a light combining surface 173 for combining the first light beam LBA and the second light beam LBB. The light combining element 170 includes a first incident surface 171, a second incident surface 172, a light combining surface 173, and an emitting surface 174. The first light beam LBA emitted from the first semiconductor laser 110 is made incident on the first incident surface 171. The second light beam LBB emitted from the second semiconductor laser 120 and reflected by the light reflecting element 160 is made incident on the second incident surface 172. The light combining surface 173 transmits approximately 100% of the first light beam LBA and reflects (e.g., totally reflects) approximately 100% of the second light beam LBB and combines the first light beam LBA and the second light beam LBB. The emitting surface 174 emits the light beam LB obtained by combining the first light beam LBA and the second light beam LBB on the light combining surface 173.

The first incident surface 171 is a surface parallel to the xy plane. The second incident surface 172 is a surface parallel to a yz plane. The emitting surface 174 is a surface parallel to the xy plane. The light combining surface 173 is a surface disposed at an angle of 45° with respect to the two incident surfaces 171 and 172. The light combining element 170 includes a ½ wavelength plate 175 on the second incident surface 172 on which the second light beam LBB is made incident and includes a ¼ wavelength plate 176 on the emitting surface 174 that emits the light beam LB.

The holder 140 fixes the light reflecting element 160 between the second light emitting surface 122 of the second semiconductor laser 120 and the second incident surface 172 of the light combining element 170. The light reflecting element 160 is present in a position facing the second light emitting surface 122 of the second semiconductor laser 120 in the z-axis direction. The light reflecting element 160 includes a reflecting surface 161 that reflects the second light beam LBB emitted from the second light emitting surface 122 and turns back the second light beam LBB 90° toward the ½ wavelength plate 175. The holder 140 fixes the light reflecting element 160 such that the reflecting surface 161 of the light reflecting element 160 is disposed at an angle of 45° with respect to both of the second light emitting surface 122 of the second semiconductor laser 120 and the second incident surface 172 of the light combining element 170.

Both of the first light beam LBA emitted by the first semiconductor laser 110 and the second light beam LBB emitted by the second semiconductor laser 120 are light beams of linearly polarized light. A polarization direction of the first light beam LBA and a polarization direction of the second light beam LBB coincide with each other. For example, the polarization direction of the first light beam LBA and the polarization direction of the second light beam LBB are parallel to the x axis. That is, both of the first semiconductor laser 110 and the second semiconductor laser 120 emit light beams of P polarized light to the light combining surface 173 of the light combining element 170.

A ray axis of the ½ wavelength plate 175 is set to convert P polarized light into S polarized light. A ray axis of the ¼ wavelength plate 176 is set to convert the P polarized light and the S polarized light into circularly polarized light. That is, the ray axis of the ¼ wavelength plate 176 is set to 45 degrees with respect to a polarization direction of the P polarized light and the S polarized light.

The first light beam LBA of the P polarized light, which is divergent light, emitted from the first semiconductor laser 110 is made incident on the light combining element 170 via the first incident surface 171, transmitted approximately 100% through the light combining surface 173, and emitted from the emitting surface 174. The first light beam LBA of the P polarized light emitted from the light combining element 170 passes through the ¼ wavelength plate 176 to thereby be converted into a light beam of circularly polarized light. Thereafter, the first light beam LBA of the divergent light passes through the collimator lens 31 to thereby be converted into a light beam of substantially parallel light.

The second light beam LBB of the P polarized light, which is the divergent light, emitted from the second semiconductor laser 120 is reflected by the reflecting surface 161 of the light reflecting element 160, made incident on the ½ wavelength plate 175, and passes through the ½ wavelength plate 175 to thereby be converted into a light beam of S polarized light. Thereafter, the second light beam LBB is made incident on the light combining element 170 via the second incident surface 172, reflected approximately 100% by the light combining surface 173, and emitted from the emitting surface 174. The second light beam LBB of the S polarized light emitted from the light combining element 170 passes through the ¼ wavelength plate 176 to thereby be converted into a light beam of circularly polarized light. Thereafter, the second light beam LBB of the divergent light passes through the collimator lens 31 to thereby be converted into a light beam of substantially parallel light.

Note that the first light beam LBA of the P polarized light being converted into the light beam of the circularly polarized light and the second light beam LBB of the S polarized light being converted into the light beam of the circularly polarized light by the ¼ wavelength plate 176 is for the purpose of uniformizing characteristics of transmission and reflection of the first light beam LBA and the second light beam LBB in the optical components (e.g., the polygon mirror 35, the fθ lens 37, the turning-back mirror 38, and the cover glass) of the optical system of the optical scanning device 30 downstream of the ¼ wavelength plate 176.

The first light beam LBA and the second light beam LBB are combined on the light combining surface 173 of the light combining element 170 and, thereafter, pass through the collimator lens 31 to thereby be the light beam LB of the parallel light. The light beam LB travels along the optical axis LA of the optical system of the optical scanning device 30 and is condensed on the image plane IP having a finite focus. The image plane IP is the surface of the photoconductive drum 27. In FIG. 9, for convenience, the optical axis LA of the optical system of the optical scanning device 30 is drawn by a straight line.

The LD socket 130 functions to mount the second semiconductor laser 120 on the substrate 150 of the light source module 100 higher than the first semiconductor laser 110. In other words, the second light emitting surface 122 of the second semiconductor laser 120 can be brought close to the light combining surface 173 of the light combining element 170 by providing the LD socket 130 between the second semiconductor laser 120 and the substrate 150. That is, in this embodiment, an optical path length (e.g., a first optical path length) of the first light beam LBA from the first light emitting surface 112 of the first semiconductor laser 110 to the light combining surface 173 of the light combining element 170 and an optical path length (a second optical path length) of the second light beam LBB from the second light emitting surface 122 of the second semiconductor laser 120 to the light combining surface 173 of the light combining element 170 are set to the same length by providing the LD socket 130 having height in the axial direction between the substrate 150 and the second semiconductor laser 120. The first optical path length represents a length of a first optical path followed by the first light beam LBA from the first light emitting surface 112 to the light combining surface 173. The second optical path length represents a length of a second optical path followed by the second light beam LBB from the second light emitting surface 122 to the light combining surface 173.

In this way, the first optical path length until the first light beam LBA emitted from the first light emitting surface 112 of the first semiconductor laser 110 is made incident on the light combining surface 173 and the second optical path length until the second light beam LBB emitted from the second light emitting surface 122 of the second semiconductor laser 120 is made incident on the light combining surface 173 are aligned to the same length. Consequently, it is possible to adjust a back focus for the collimator lens 31 and mount the first semiconductor laser 110 and the second semiconductor laser 120 on the same one substrate 150.

LD Socket

Figure 11:
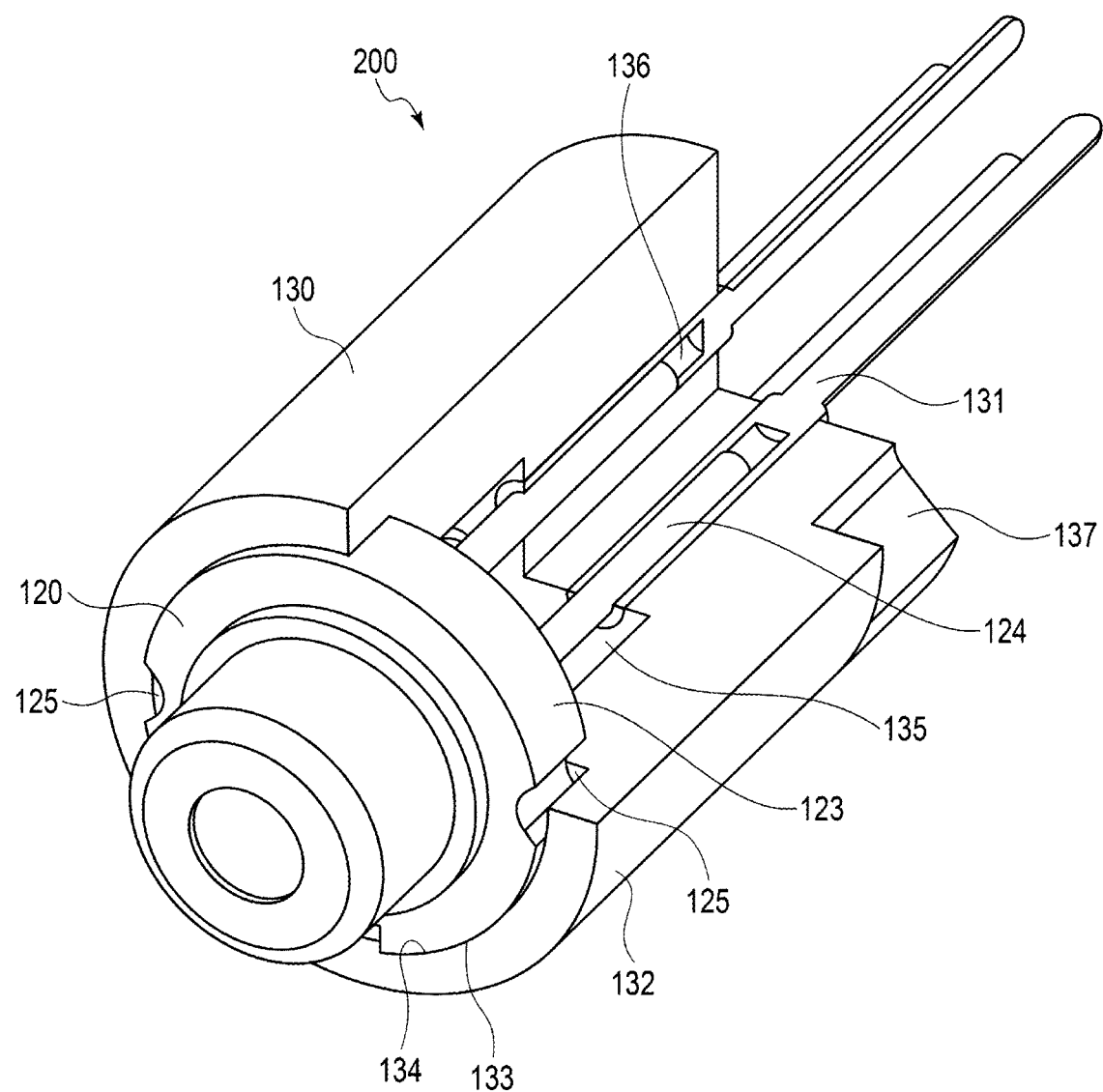
FIG. 11 is a perspective view illustrating an assembly in which a second semiconductor laser and an LD socket illustrated in FIG. 10 are connected.
Figure 12:
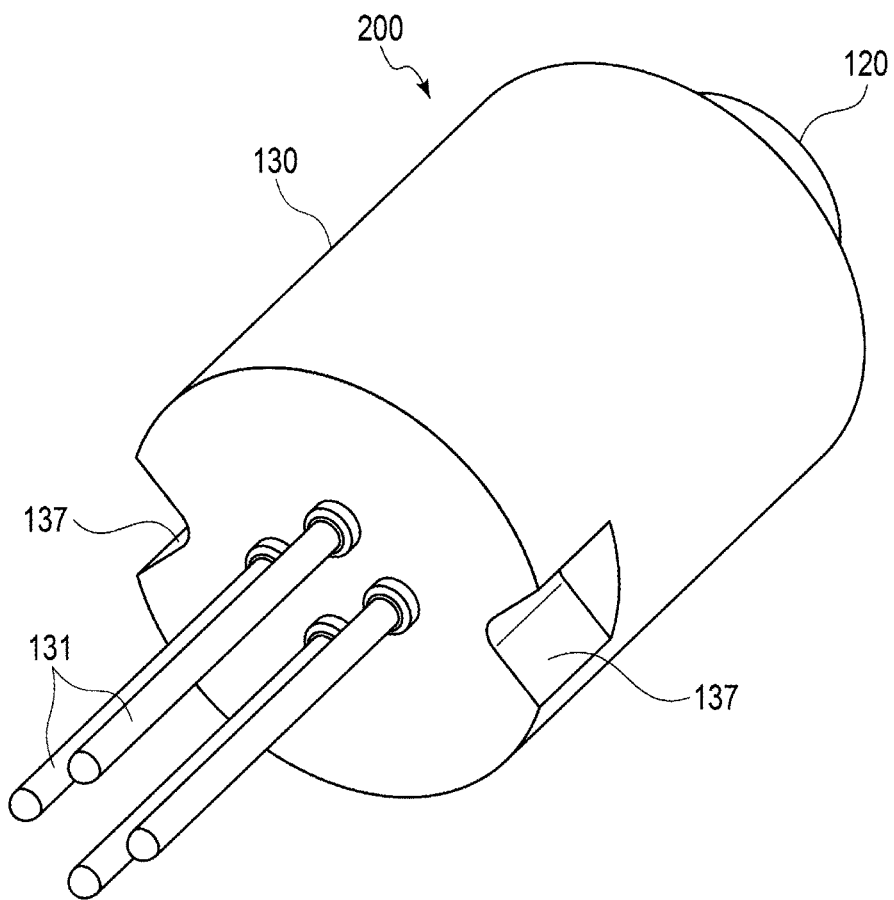
FIG. 12 is a perspective view of the assembly illustrated in FIG. 11 viewed from a connection terminal side of the LD socket.
Figure 13:
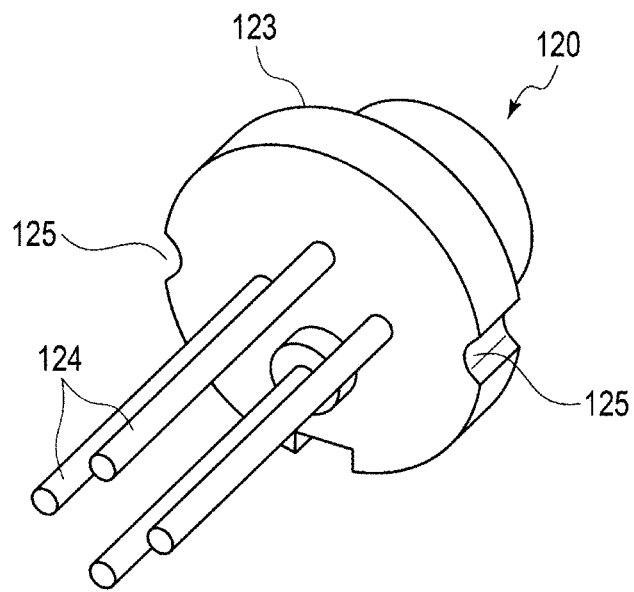
FIG. 13 is a perspective view illustrating the second semiconductor laser of the assembly illustrated in FIG. 11.

Subsequently, the LD socket 130 is explained with reference to FIGS. 11 to 13. FIG. 11 is a perspective view illustrating an assembly 200 in which the second semiconductor laser 120 and the LD socket 130 are connected. The second semiconductor laser 120 is, for example, a semiconductor laser of a two-beam array. In FIG. 11, a part of the LD socket 130 is broken in order to illustrate a connecting structure of the second semiconductor laser 120 and the LD socket 130. FIG. 12 is a perspective view of the assembly 200 illustrated in FIG. 11 viewed from the connection terminals 131 side of the LD socket 130. FIG. 13 is a perspective view of the second semiconductor laser 120, which is connected to the LD socket 130, viewed from the second connection terminals 124 side.

The LD socket 130 includes a substantially cylindrical main body 132 made of resin and four connection terminals 131. In the case of the two-beam array, the number of connection terminals 131 is four. For example, the main body 132 can be formed by integral molding in a state in which the main body 132 includes the connection terminals 131 on one end side in the axial direction of the main body 132. The connection terminals 131 extend from one end side in the axial direction of the main body 132. The main body 132 includes, at the other end side thereof, a hole section 133 for fitting the second CAN package 123 of the second semiconductor laser 120. The hole section 133 has a shape obtained by coaxially connecting a substantially cylindrical large diameter portion 134 in which the second CAN package 123 is fit and a substantially cylindrical small diameter portion 135 smaller in diameter than the large diameter portion 134. The large diameter portion 134 opens to the other end side in the axial direction of the main body 132. The small diameter portion 135 extends from the bottom of the large diameter portion 134 to the center in the axial direction of the main body 132.

The large diameter portion 134 of the hole section 133 has a precise fitting shape in which the second CAN package 123 can be fit. Accordingly, the second CAN package 123 can be press-fit into the large diameter portion 134 and can be fixed to the LD socket 130 by tight fitting. Alternatively, the large diameter portion 134 may have a size enough for loosely fitting the second CAN package 123 in the large diameter portion 134. In this case, the second CAN package 123 is disposed in the large diameter portion 134 by clearance fitting and fixed by an adhesive or the like.

The connection terminals 131 of the LD socket 130 include, on a proximal end side embedded in the main body 132, connection holes 136 or aperture for inserting and connecting the second connection terminals 124 of the second semiconductor laser 120. The connection holes 136 of the connection terminals 131 are opened on the bottom surface of the small diameter portion 135 of the hole section 133 of the main body 132. Therefore, if the second CAN package 123 of the second semiconductor laser 120 is fit in the large diameter portion 134 of the hole section 133 of the main body 132, the second connection terminals 124 of the second semiconductor laser 120 are inserted into the connection holes 136 of the connection terminals 131 of the LD socket 130 and the second connection terminals 124 and the connection terminals 131 electrically conduct.

The LD socket 130 includes two gripping sections 137 or recesses on one end side of the main body 132. The two gripping sections 137 are present in positions facing each other in the radial direction of the LD socket 130 and are compatible with two gripping sections 125 included in the second CAN package 123 of the second semiconductor laser 120. The two gripping sections 137 have a shape obtained by cutting off a part of the main body 132. The gripping sections 137 are portions chucked by gripping members 302 (FIG. 18) of a not-illustrated adjusting device if the assembly 200 is aligned with the holder 140. For example, if the first semiconductor laser 110 is aligned with the holder 140, the two gripping sections 115 (FIG. 9) of the first CAN package 113 can be chucked by gripping members 301 (FIG. 18) having the same structure. The first semiconductor laser 110 can be aligned with the holder 140.

The light source module 100 according to embodiments is explained with reference to FIGS. 14 to 17.

First Embodiment

In the light source module 100 according to a first embodiment, the first semiconductor laser 110 and the second semiconductor laser 120 respectively include the first LD chip 111 and the second LD chip 121 of two-beam arrays.

Figure 14A:
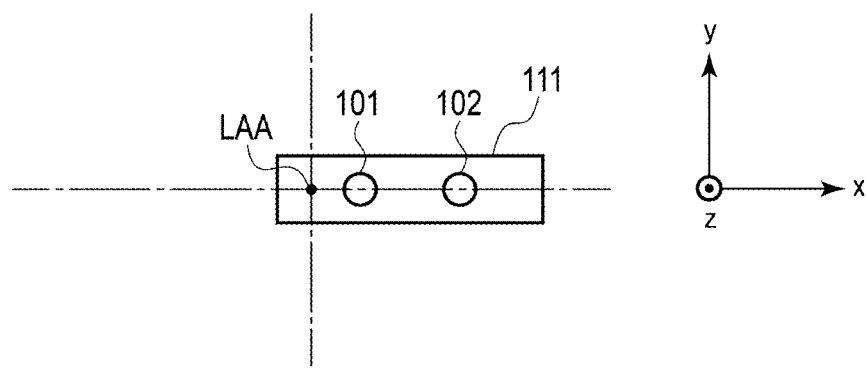
FIG. 14A is a diagram of a first LD chip in a light source module according to a first embodiment viewed from an emission side of a first light beam.
Figure 14B:
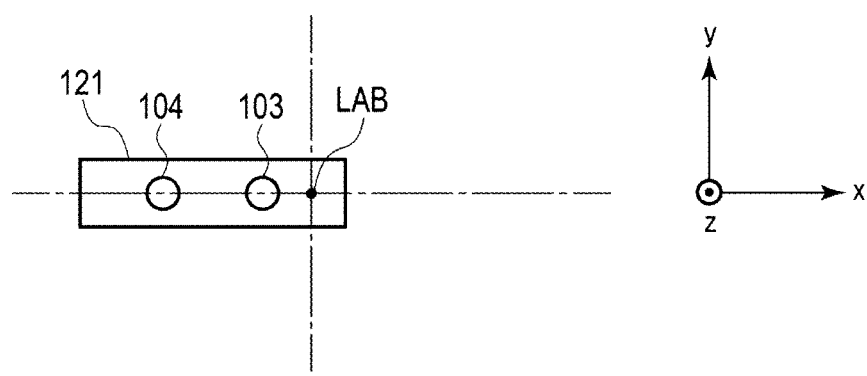
FIG. 14B is a diagram of a second LD chip in the light source module viewed from an emission side of a second light beam.
Figure 14C:
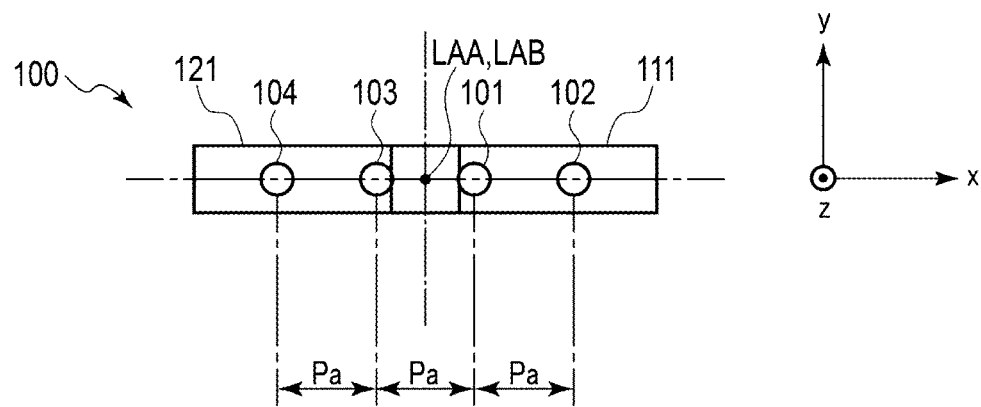
FIG. 14C is a diagram illustrating the first LD chip illustrated in FIG. 14A and the second LD chip illustrated in FIG. 14B to be superimposed each other on an optical axis.
Figure 14D:
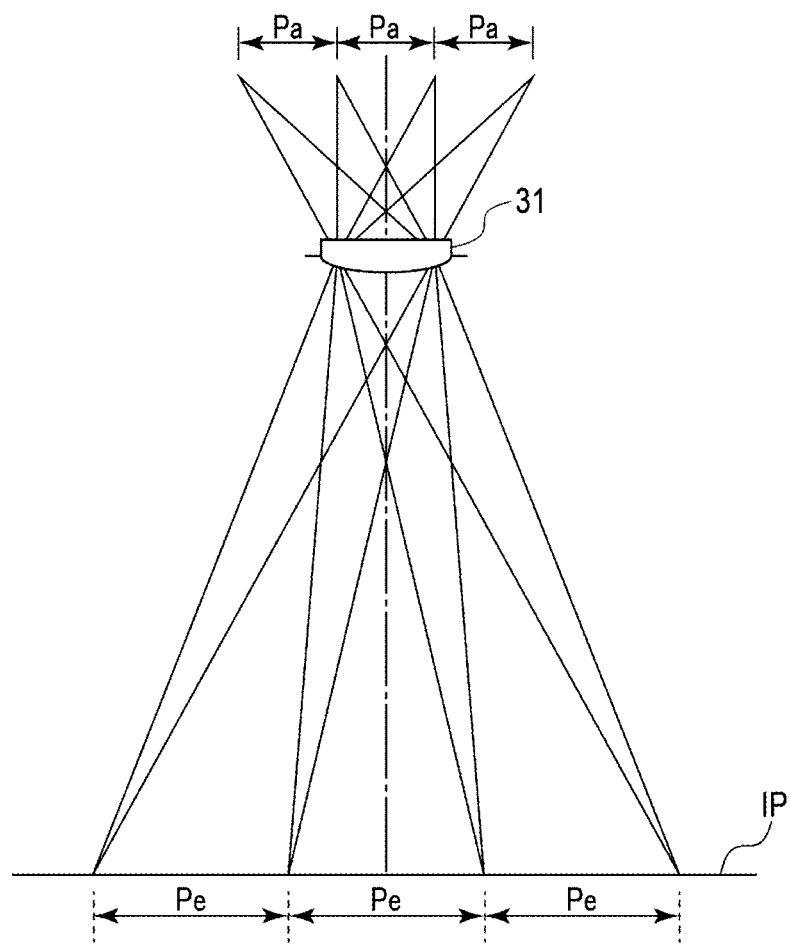
FIG. 14D is a diagram illustrating an optical system of an optical scanning device for the light source module in a simplified form.
Figure 14E:
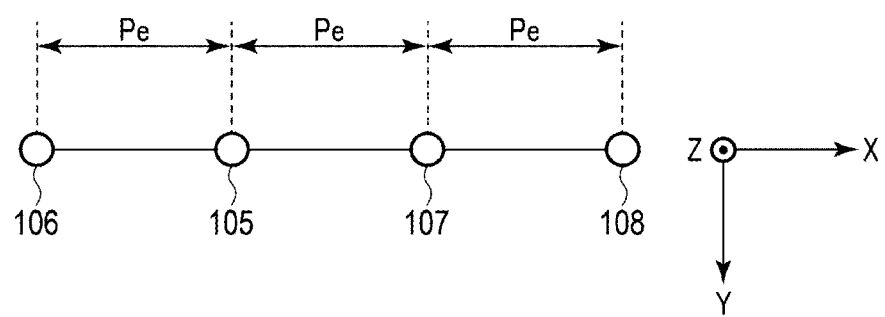
FIG. 14E is a diagram illustrating four condensing spots formed on an image plane by light beams emitted by the two LD chips illustrated in FIG. 14C.

FIG. 14A is a diagram of the first LD chip 111 viewed from an emission side of the first light beam LBA. FIG. 14B is a diagram of the second LD chip 121 viewed from an emission side of the second light beam LBB. FIG. 14C is a diagram in which the first LD chip 111 illustrated in FIG. 14A and the second LD chip 121 illustrated in FIG. 14B are superimposed each other on optical axes LAA and LAB. Like FIG. 9, FIG. 14D is a diagram illustrating the optical system of the optical scanning device 30 in a simplified form. Optical paths between the first LD chip 111 and the collimator lens 31 and between the second LD chip 121 and the collimator lens 31 are illustrated in an omitted state. FIG. 14E is a plan view illustrating four condensing spots 105, 106, 107, and 108 formed on the image plane IP by light beams emitted by two LD chips 111 and 121 illustrated in FIG. 14C.

In the light source module 100 according to the first embodiment, two light emitting sections 101 and 102 of the first LD chip 111 are arranged on a straight line in parallel to the x axis and two light emitting sections 103 and 104 of the second LD chip 121 are also arranged on a straight line in parallel to the x axis. Both of an interval along the x axis between the two light emitting sections 101 and 102 of the first LD chip 111 and an interval along the x axis between the two light emitting sections 103 and 104 of the second LD chip 121 are Pa. Further, an interval along the x axis between the light emitting section 101 on the inner side of the first LD chip 111 and the light emitting section 103 on the inner side of the second LD chip 121 is also Pa. That is, concerning the x direction, four light emitting sections 101, 102, 103, and 104 of the two LD chips 111 and 121 are arranged at an equal interval of Pa.

The optical axis LAA of the first LD chip 111 passes an intersection of a straight line passing the centers of the light emitting section 101 and the light emitting section 102 and a straight line parallel to the y axis bisecting an interval in the x direction between the center of the light emitting section 101 on the inner side of the first LD chip 111 and the center of the light emitting section 103 on the inner side of the second LD chip 121. The optical axis LAB of the second LD chip 121 passes an intersection of a straight line passing the centers of the light emitting section 103 and the light emitting section 104 and the straight line parallel to the y axis bisecting the interval in the x direction between the center of the light emitting section 101 on the inner side of the first LD chip 111 and the center of the light emitting section 103 on the inner side of the second LD chip 121.

Four light beams emitted from the two LD chips 111 and 121 are condensed on the image plane IP by the optical system of the optical scanning device 30 including the collimator lens 31 and form four condensing spots 105, 106, 107, and 108. The four condensing spots 105, 106, 107, and 108 are arranged on a straight line in parallel to the X axis. All of intervals along the X axis among the four condensing spots 105, 106, 107, and 108 are Pe. The optical axis LA passes a point bisecting an interval between the centers of the condensing spot 105 and the condensing spot 107. In other words, the optical axis LA passes the center of gravity of the four condensing spots 105, 106, 107, and 108.

Figure 15:
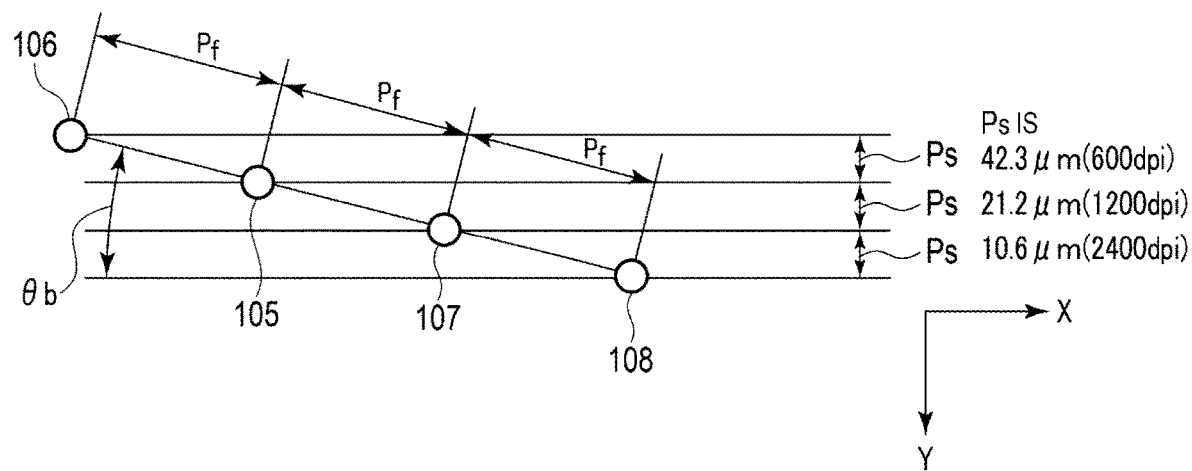
FIG. 15 is a diagram illustrating four condensing spots actually formed on the image plane by two light beams emitted by the light source module fixed to a housing after angle adjustment.

FIG. 15 is a plan view illustrating the four condensing spots 105, 106, 107, and 108 actually formed on the image plane IP by the two light beams LBA and LBB emitted by the light source module 100 according to the first embodiment fixed to the housing 40 after angle adjustment. All of intervals among the four condensing spots 105, 106, 107, and 108 are Pf. Here, Pf does not coincide with Pe because, in the case of a scanning optical system, the magnification of the optical system is sometimes different in the main scanning direction (e.g., the X direction) and the sub-scanning direction (e.g., the Y direction).

An angle of the light source module 100 is adjusted around the optical axis LA if the light source module 100 is fixed to the housing 40. A straight line passing the centers of the four condensing spots 105, 106, 107, and 108 is adjusted to form an angle of θb with respect to the main scanning direction, that is, the X direction. In an example, θb is an angle at which the four condensing spots 105, 106, 107, and 108 adjacent to one another is shifted in the Y direction by Ps in order to obtain desired resolution in the sub-scanning direction. Ps is 42.3 µm at the time of 600 dpi, is 21.2 µm at the time of 1200 dpi, and is 10.6 µm at the time of 2400 dpi.

In order to obtain such disposition of the condensing spots 105, 106, 107, and 108, if the light source module 100 is fixed to the housing 40, after the angle around the optical axis LA of the light source module 100 is adjusted, the light source module 100 is fixed to the housing 40 by means such as bonding or screwing such that the disposition of the condensing spots 105, 106, 107, and 108 illustrated in FIG. 15 can be obtained.

Second Embodiment

Subsequently, the light source module 100 according to a second embodiment is explained with reference to FIGS. 16A to 16E and FIG. 17. In the second embodiment, as in the first embodiment, a layout on the xy plane of the first LD chip 111 of the first semiconductor laser 110 and the second LD chip 121 of the second semiconductor laser 120 is modified.

FIGS. 16A to 16E and FIG. 17 respectively correspond to FIGS. 14A to 14E and FIG. 15 in the first embodiment. Therefore, meanings of FIGS. 16A to 16E and FIG. 17 are respectively the same as the meanings of FIGS. 14A to 14E and FIG. 15. In the following explanation, in order to avoid redundant explanation, differences from the first embodiment are mainly explained.

In the light source module 100 according to the second embodiment, the two light emitting sections 101 and 102 of the first LD chip 111 are arranged on a straight line in parallel to the x axis and the two light emitting sections 103 and 104 of the second LD chip 121 are also arranged on a straight line in parallel to the x axis. Both of an interval along the x axis between the two light emitting sections 101 and 102 of the first LD chip 111 and an interval along the x axis between the two light emitting sections 103 and 104 of the second LD chip 121 are Pa. The above explanation is the same as the explanation of the light source module 100 according to the first embodiment.

In the light source module 100 according to the second embodiment, the light emitting section 101 on the inner side of the first LD chip 111 is disposed in, concerning the x direction, a position bisecting an interval between the centers of the two light emitting sections 103 and 104 of the second LD chip 121. The light emitting section 103 on the inner side of the second LD chip 121 is disposed in, concerning the x direction, a position bisecting an interval between the centers of the two light emitting sections 101 and 102 of the first LD chip 111. That is, the four light emitting sections 101, 102, 103, and 104 of the two LD chips 111 and 121 are arranged at an equal interval of Pa/2 along the x axis.

The optical axis LAA of the first LD chip 111 passes an intersection of a straight line passing the centers of the light emitting section 101 and the light emitting section 102 and a straight line parallel to the y axis bisecting an interval in the x direction between the centers of the light emitting section 101 on the inner side of the first LD chip 111 and the light emitting section 103 on the inner side of the second LD chip 121. The optical axis LAB of the second LD chip 121 passes an intersection of a straight line passing the centers of the light emitting section 103 and the light emitting section 104 and the straight line parallel to the y axis bisecting the interval in the x direction between the centers of the light emitting section 101 on the inner side of the first LD chip 111 and the light emitting section 103 on the inner side of the second LD chip 121.

As in the first embodiment, four light beams emitted from the two LD chips 111 and 121 are condensed on the image plane IP by the optical system of the optical scanning device 30 including the collimator lens 31 and form the four condensing spots 105, 106, 107, and 108. The four condensing spots 105, 106, 107, and 108 are arranged on a straight line in parallel to the X axis. However, in the second embodiment, all of intervals along the X axis among the four condensing spots 105, 106, 107, and 108 are Pe/2. The optical axis LA passes a point bisecting an interval between the centers of the condensing spot 105 and the condensing spot 107. In other words, the optical axis LA passes the center of gravity of the four condensing spots 105, 106, 107, and 108.

Figure 17:
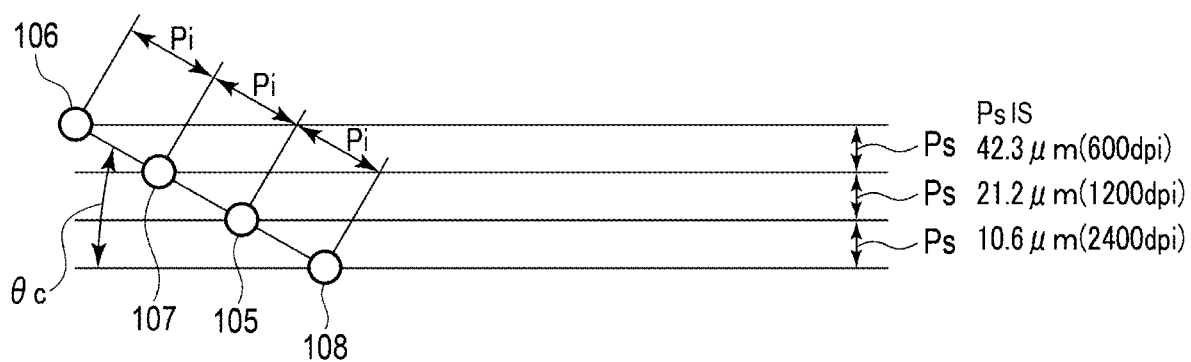
FIG. 17 is a diagram illustrating four condensing spots actually formed on the image plane by two light beams emitted by the light source module fixed to a housing after angle adjustment.

FIG. 17 is a plan view illustrating the four condensing spots 105, 106, 107, and 108 actually formed on the image plane IP by the two light beams LBA and LBB emitted by the light source module 100 according to the second embodiment fixed to the housing 40 after angle adjustment. FIG. 17 is equivalent to FIG. 15 in the first embodiment. All of intervals among the four condensing spots 105, 106, 107, and 108 are Pi. Pi is approximately Pf/2.

As explained above, if the light source module 100 is fixed to the housing 40, an angle of the light source module 100 is adjusted around the optical axis LA. A straight line passing the centers of the four condensing spots 105, 106, 107, and 108 is adjusted to form an angle of θc with respect to the main scanning direction, that is, the X direction. Resolution in the sub-scanning direction and a shift amount in the Y direction between two of the condensing spots 105, 106, 107, and 108 adjacent to each other is the same as the shift amount in the first embodiment.

Figure 16A:
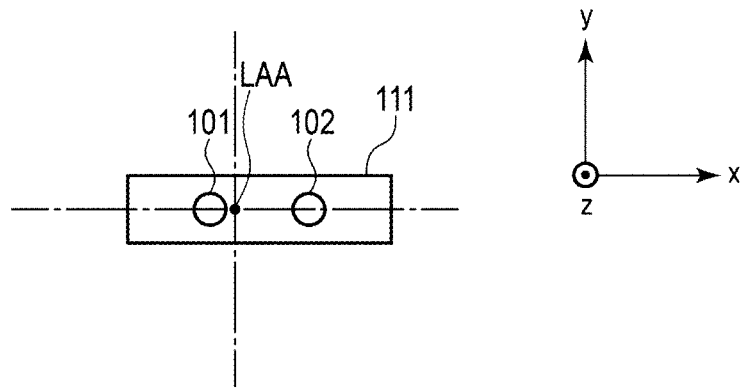
FIG. 16A is a diagram of a first LD chip in a light source module according to a second embodiment viewed from an emission side of a first light beam.
Figure 16B:
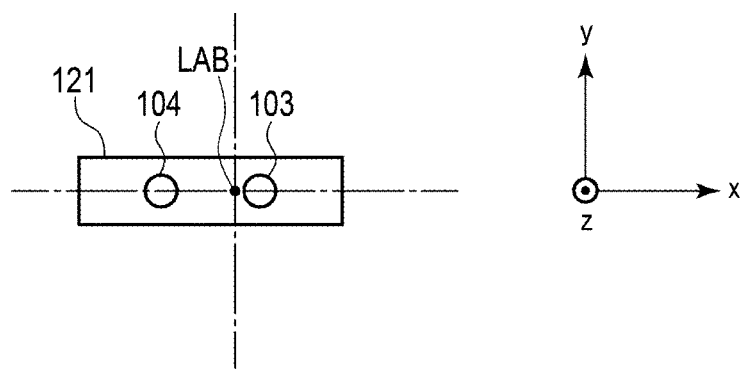
FIG. 16B is a diagram of a second LD chip in the light source module viewed from an emission side of a second light beam.
Figure 16C:
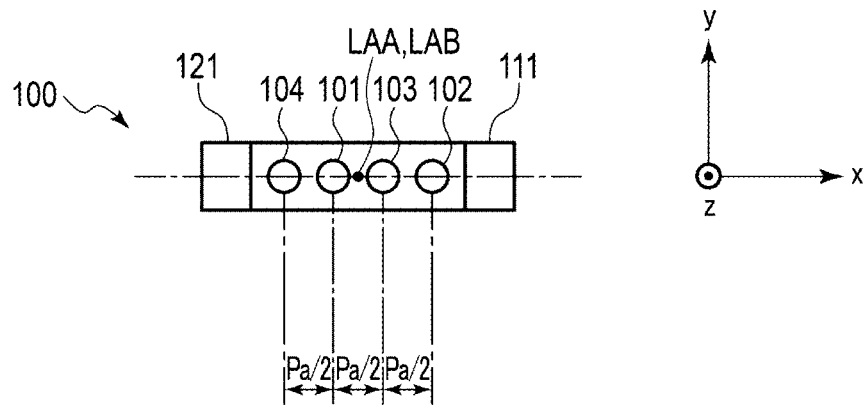
FIG. 16C is a diagram illustrating the first LD chip illustrated in FIG. 16A and the second LD chip illustrated in FIG. 16B to be superimposed each other on an optical axis.
Figure 16D:
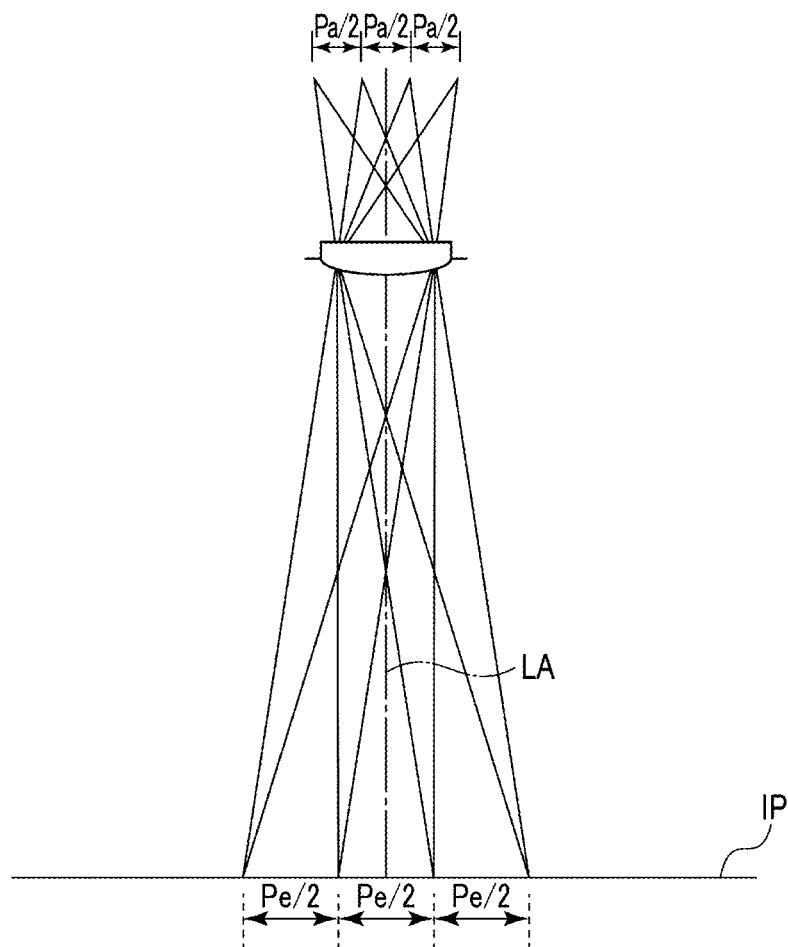
FIG. 16D is a diagram illustrating an optical system of an optical scanning device for the light source module in a simplified form.

In the second embodiment, as illustrated in FIG. 16C, the four light emitting sections 101, 102, 103, and 104 are arranged at an interval of Pe/2, which is the half of the interval in the first embodiment, concerning the x direction. Therefore, as it is seen if compared with FIGS. 15 and 17, the angle θc for rotating the light source module 100 in order to obtain the same resolution in the sub-scanning direction is approximately a double of the angle θb. Therefore, in the second embodiment, compared with the first embodiment, the sensitivity of the adjustment of the angle of the light source module 100 is lower. Consequently, it is easy to adjust the resolution in the sub-scanning direction. In other words, the resolution in the sub-scanning direction is prevented from greatly deviating at a small angle.

Figure 18:
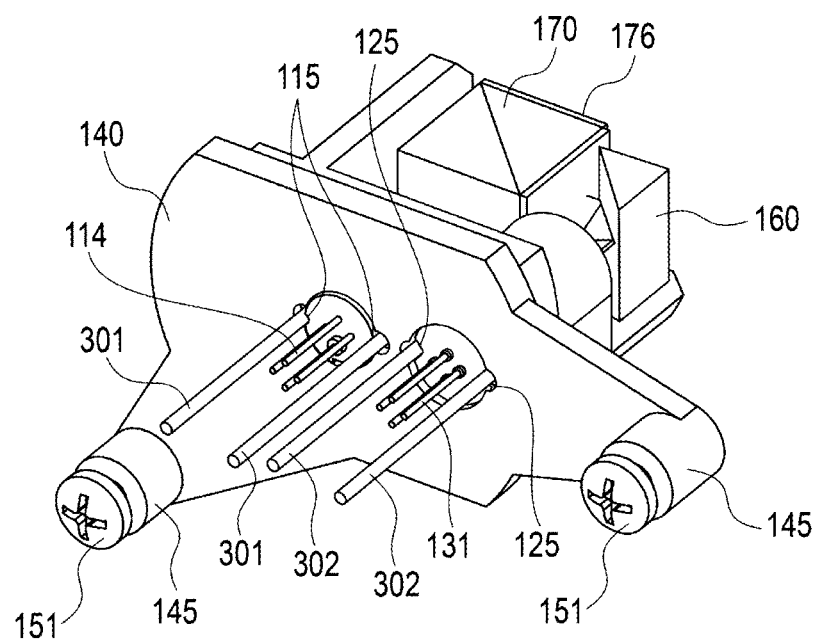
FIG. 18 is a diagram for explaining a method of adjusting the light source module illustrated in FIG. 8.

A method of adjusting the light source module 100 explained above is explained below with reference to FIGS. 9 and 18. As illustrated in FIG. 18, the adjustment of the light source module 100 is implemented in a state in which the substrate 150 is detached from the holder 140. That is, in the adjustment, an assembly illustrated in FIG. 18 in which the first semiconductor laser 110 and the second semiconductor laser 120 are attached to the holder 140 is attached to the housing 40. An adjustment device or fixture includes elongated bar-like two gripping members 301 for gripping the first semiconductor laser 110 and elongated bar-like two gripping members 302 for gripping the second semiconductor laser 120.

The adjustment device inserts the distal ends of the gripping members 301 into the gripping sections 115 of the first CAN package 113 of the first semiconductor laser 110 housed in the first attachment hole 141 of the holder 140 to hold and bind the first CAN package 113 and grips the first semiconductor laser 110 to be movable with respect to the holder 140. The adjustment device inserts the distal ends of the gripping members 302 into the gripping sections 137 of the LD socket 130 housed in the second attachment hole 142 of the holder 140 to hold and bind the LD socket 130 and grips the LD socket 130 to be movable with respect to the holder 140. As explained above, since the gripping sections 115 and the gripping sections 137 are compatible, the gripping members 301 and the gripping members 302 can be formed in the same shape.

If the positions of the first semiconductor laser 110 and the second semiconductor laser 120 are adjusted with respect to the holder 140, an adjustment dedicated connector of the adjustment device and the first connection terminals 114 of the first semiconductor laser 110 and the connection terminals 131 of the LD socket 130 are respectively connected, the first light beam LBA is emitted from the first semiconductor laser 110, and the second light beam LBB is emitted from the second semiconductor laser 120. The first light beam LBA and the second light beam LBB are monitored. The positions of the first semiconductor laser 110 and the second semiconductor laser 120 are aligned with respect to the optical axes LAA and LAB of the collimator lens 31.

As explained above, the first semiconductor laser 110 has flexibility of movement with respect to the holder 140 in the X-axis direction, the Y-axis direction, and the rotating direction centering on the Z axis. The first semiconductor laser 110 is capable of moving in the X-axis direction and the Y-axis direction and rotating in a state in which the first CAN package 113 is struck against the positioning step section 143 of the first attachment hole 141 of the holder 140. The LD socket 130 (that is, the second semiconductor laser 120) has flexibility of movement with respect to the holder 140 in the Z-axis direction and the rotating direction centering on the Z axis. The collimator lens 31 has flexibility of movement in the X-axis direction, the Y-axis direction, and the Z-axis direction.

If the positions of the first semiconductor laser 110 and the second semiconductor laser 120 are adjusted with respect to the holder 140, for example, the adjustment is implemented in the following procedure. First, the collimator lens 31 is moved in the X-axis direction and the Y-axis direction with respect to the housing 40 to adjust the optical axis of the collimator lens 31 to the optical axis LAB of the second light beam LBB emitted from the second semiconductor laser 120. The holder 140 holding the first semiconductor laser 110 and the second semiconductor laser 120 has flexibility of turning centering on the optical axis LA with respect to the housing 40 but does not have flexibility of movement in the X-axis direction and the Y-axis direction with respect to the housing 40. The LD socket 130 fixing the second semiconductor laser 120 does not have flexibility of movement in the X-axis direction and the Y-axis direction with respect to the holder 140. Accordingly, the adjustment of the second semiconductor laser 120 in the X-axis direction and the Y-axis direction with respect to the collimator lens 31 is implemented by moving the collimator lens 31 in the X-axis direction and the Y-axis direction with respect to the housing 40.

Subsequently, in a state in which the first CAN package 113 of the first semiconductor laser 110 is set in contact with the positioning step section 143 of the first attachment hole 141 of the holder 140, the first semiconductor laser 110 is moved in the X-axis direction and the Y-axis direction with respect to the holder 140 to adjust the optical axis LAA of the first light beam LBA emitted from the first semiconductor laser 110 to the optical axis of the collimator lens 31.

Figure 16E:
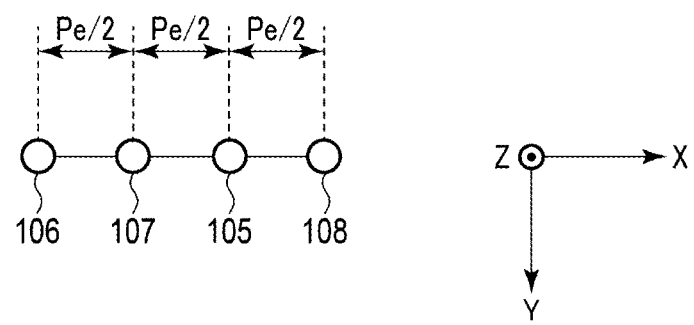
FIG. 16E is a diagram illustrating four condensing spots formed on an image plane by light beams emitted by the two LD chips illustrated in FIG. 16C.

Subsequently, the first semiconductor laser 110 and the LD socket 130 to which the second semiconductor laser 120 is connected are respectively turned around the Z axis to adjust beams on the image plane IP to be arranged on a straight line (FIGS. 14E and 16E). Thereafter, the first semiconductor laser 110 is bonded and fixed to the holder 140.

Subsequently, the collimator lens 31 is moved in the Z-axis direction to adjust the first light beam LBA emitted from the first semiconductor laser 110 to be condensed on the image plane IP. After the position of the collimator lens 31 is adjusted, the collimator lens 31 is bonded and fixed to the housing 40.

Finally, the LD socket 130 to which the second semiconductor laser 120 is connected is moved in the Z-axis direction to adjust the second light beam LBB emitted from the second semiconductor laser 120 to be condensed on the image plane IP. After the position of the second semiconductor laser 120 is adjusted, the LD socket 130 is bonded and fixed to the holder 140.

As explained above, according to this embodiment, since the LD socket 130 is provided between the second semiconductor laser 120, which makes the second light beam LBB incident on the light combining element 170 via the light reflecting element 160, and the substrate 150, it is possible to align an optical path length with an optical path length of the first semiconductor laser 110 that makes the first light beam LBA directly incident on the light combining element 170 and it is possible to adjust a back focus for the collimator lens 31. Therefore, according to this embodiment, the first semiconductor laser 110 and the second semiconductor laser 120 can be mounted on the same one substrate 150.

According to this embodiment, since the second semiconductor laser 120 is coaxially connected to the LD socket 130, it is possible to cause the turning center of the LD socket 130 to coincide with the turning center of the second semiconductor laser 120 at the time of adjustment for turning the second semiconductor laser 120 centering on the z axis. Therefore, even if the LD socket 130 is provided between the second semiconductor laser 120 and the substrate 150, the turning center of the second semiconductor laser 120 does not deviate and it is possible to perform accurate adjustment.

Note that, in the embodiment explained above, the LD socket 130 is provided only between the second semiconductor laser 120 and the substrate 150 in order to adjust the back focus for the collimator lens 31. However, another LD socket may be provided between the first semiconductor laser 110 and the substrate 150. The first optical path length from the first light emitting surface 112 of the first semiconductor laser 110 to the light combining surface 173 of the light combining element 170 and the second optical path length from the second light emitting surface 122 of the second semiconductor laser 120 to the light combining surface 173 of the light combining element 170 only has to be able to be set the same.

In the embodiment explained above, the positions of the first semiconductor laser 110 and the second semiconductor laser 120 are highly accurately adjusted with respect to the holder 140 in order to adjust the back focus for the collimator lens 31. However, if a light source module does not require high adjustment accuracy, the two semiconductor lasers 110 and 120 may be held by simple application of the first and second semiconductor lasers 110 and 120 to the holder 140.

While certain embodiments have been described, these embodiments have been presented by way of example only, and are not intended to limit the scope of invention. Indeed, the novel apparatus and methods described herein may be embodied in a variety of other forms; furthermore, various omissions, substitutions and changes in the form of the apparatus and methods described herein may be made without departing from the spirit of the inventions. The accompanying claims and their equivalents are intended to cover such forms or modifications as would fall within the scope and spirit of the inventions.

What is claimed is:

1. A light source module comprising:
   a substrate;
   a first light source mounted on the substrate and configured to emit a first light beam having a first optical axis;
   a second light source mounted on the substrate and configured to emit a second light beam parallel to the first light beam;
   a beam combiner configured to combine and emit the first light beam and the second light beam;
   an adjuster including a socket connected to the second light source and disposed between the substrate and the second light source, wherein the socket is a rotating body having a second optical axis of the second light beam as a center axis, the second light source being coaxially connected to the socket; and
   a holder holding the first light source and the socket,
   wherein the adjuster is configured to adjust a mounting height of at least one of the first light source or the second light source on the substrate to vary at least one of (a) a first optical path length of the first light beam, the first optical path length extending from the first light source to a position where the first light beam is combined with the second light beam by the beam combiner or (b) a second optical path length of the second light beam, the second optical path length extending from the second light source to the position where the first light beam is combined with the second light beam by the beam combiner.

2. The light source module of claim 1, wherein the adjuster is configured to adjust the mounting height of at least one of the first light source or the second light source to equalize the first optical path length and the second optical path length.

3. The light source module of claim 1, further comprising a reflector configured to reflect the second light beam emitted from the second light source toward the beam combiner.

4. The light source module of claim 1, wherein the holder includes a first housing section that houses the first light source, the first housing section permitting movement of the first light source in a direction orthogonal to the first optical axis of the first light beam.

5. The light source module of claim 4, wherein the first housing section includes a movement restricting section against that engages the first light source to restrict movement of the first light source in a direction along the first optical axis.

6. The light source module of claim 4, wherein the holder includes a second housing section that receives the socket, the socket being movable relative to the holder in a direction along the center axis.

7. The light source module of claim 6, wherein the first housing section and the second housing section of the holder are integrally formed.

8. The light source module of claim 6, wherein the second housing section is a hole section permitting turning of the socket about the center axis, and the hole section restricts movement of the socket in a direction crossing the center axis.

9. The light source module of claim 1, wherein the socket includes a first connection terminal that extends a second connection terminal of the second light source.

10. The light source module of claim 9, wherein the socket defines an aperture configured to receive the second connection terminal of the second light source.

11. The light source module of claim 1, wherein the socket defines a pair of recesses each extending radially inward toward a center axis of the socket.

12. The light source module of claim 11, wherein the socket includes a first end portion defining an aperture that receives the second light source and a second end portion that defines the recesses.

13. The light source module of claim 1, wherein the first light source defines a pair of recesses each extending radially inward toward a center axis of the first light source.

14. The light source module of claim 1, wherein the first light source is a laser.

* * * * *